US006380612B1

(12) United States Patent
Jang et al.

(10) Patent No.: US 6,380,612 B1

(45) Date of Patent: Apr. 30, 2002

(54) THIN FILM FORMED BY INDUCTIVELY COUPLED PLASMA

(75) Inventors: Jin Jang; Jae-gak Kim; Se-Il Cho, all of Seoul (KR)

(73) Assignee: Hyundai Display Technology, Inc., Kyoungki-do (KR)

(*) Notice: Subject to any disclaimer, the term of this patent is extended or adjusted under 35 U.S.C. 154(b) by 0 days.

(21) Appl. No.: 09/517,077

(22) Filed: Mar. 1, 2000

Related U.S. Application Data

(62) Division of application No. 08/820,293, filed on Mar. 18, 1997.

(51) Int. Cl.[7] .................................... H01L 21/31

(52) U.S. Cl. .................... 257/649; 438/763; 438/765; 438/788

(58) Field of Search .................... 257/649; 438/763, 438/765, 788

(56) References Cited

U.S. PATENT DOCUMENTS

| | | | | |
|---|---|---|---|---|
| 4,804,608 A | | 2/1989 | Tawada | 430/85 |
| 5,284,789 A | * | 2/1994 | Mori et al. | 437/113 |
| 5,326,712 A | | 7/1994 | Bae | 437/40 |
| 5,436,489 A | * | 7/1995 | Murase | 257/401 |
| 5,677,236 A | | 10/1997 | Saitoh et al. | 437/109 |
| 5,683,548 A | * | 11/1997 | Hartig et al. | 156/643.1 |
| 5,744,378 A | * | 4/1998 | Homma | 437/195 |
| 5,804,454 A | | 9/1998 | Mori et al. | 437/40 |

FOREIGN PATENT DOCUMENTS

| | | |
|---|---|---|
| EP | 0379828 | 12/1989 |
| EP | 0421348 | 10/1990 |
| EP | 0520519 | 6/1992 |
| EP | 0522490 | 12/1992 |
| EP | 0601468 | 12/1993 |
| JP | 59-127647 | 7/1984 |
| JP | 62-158320 | 7/1987 |
| JP | 64-000730 | 1/1989 |
| JP | 02-243764 | 9/1990 |
| JP | 04-065120 | 3/1992 |
| JP | 07-073997 | 3/1995 |
| JP | 07-312348 | 11/1995 |
| JP | 8260154 | 8/1996 |

OTHER PUBLICATIONS

K.J. Lim,"Breakdown and Conduction Phenoena is MIS Structure", IEEE 1992 vol. 27 No. 3.*

"Electrostatic Couping of Antenna and the Shielding Effect", H. Sugai et al, *Journal of Appl. Phys.* vol. 33 pp. 2189–2193, Pat. 1, No. 4B, Apr. 1994.

"High Rate and Highly Selecting $SiO_2$ Etching Employing Inductively Coupled Plasma and Discussion on Reaction Kinetics", Y. Horiike et al, *Journal Vac. Sci. Technology,* vol. 13, No. 3, May/Jun. 1995, pp. 801–809.

"Characterization at Different Aspect Ratios (Radius/Length) of a Radio Frequency Industively Coupled Plasma Source", P. Wainman et al, *Journal Vac Sci. Technology,* vol. A13, No. 5, Sep./Oct. 1995, pp. 2464–2469.

* cited by examiner

*Primary Examiner*—Carl Whitehead, Jr.
*Assistant Examiner*—James Mitchell

(57) ABSTRACT

Silicon nitride is formed on a supporting substrate by chemical vapor deposition using an antenna outside a vacuum reaction chamber to apply RF power to form an inductively coupled plasma from a reactant gas.

1 Claim, 11 Drawing Sheets

THIN FILM FORMED BY INDUCTIVELY COUPLED PLASMA

This is a divisional of application Ser. No. 08/820,293 filed Mar. 18, 1997.

BACKGROUND OF THE INVENTION

1. Field of Invention

This invention relates to an inductively coupled plasma chemical vapor deposition(ICP CVD) technology, and more particularly, to amorphous silicon, micro crystalline silicon, thin film silicon nitride and thin film amorphous silicon transistors fabricated by the utilization thereof.

2. Related Art

Generally, thin amorphous silicon, micro crystalline silicon and amorphous silicon film have been widely used in semiconductor and liquid crystal devices. In addition, thin amorphous silicon film transistors(a-Si TFT) have been widely used as driving elements of pixel electrodes in liquid crystal displays. In particular, a hydrogenized amorphous silicon transistor(a-Si:H TFT) is widely used for its superiority in the areas of yield and utilization in large area display devices.

Plasma enhanced chemical vapor deposition(PECVD) is currently used to manufacture thin amorphous silicon film, thin micro crystalline silicon film, thin silicon nitride film and thin amorphous silicon film transistors. But this type of vapor deposition due to its low plasma density of $10^{10}$ $cm^{-3}$ has low vapor deposition rate and requires high gas pressure. This results in fabrication problems due to polymer formation. In addition, due to the electrode substances existing in the discharge area of the reaction chamber, thin film product is contaminated thus degrading thin film quality.

As available methods of plasma production, inductively coupled plasma deposition and capacitively coupled plasma deposition are provided. Inductively coupled plasma deposition is shown to be more efficient than capacitively coupled plasma deposition. Using inductively coupled plasma deposition, it is possible to produce plasma having a higher density such as $10^{11}$–$10^{12}$ $cm^{-3}$, and for discharging to take place under low pressures such as 0.1–20 mTorr. (Refer to P. N Wainman et al., J. Vac. Sci. Technol., Al3(5), 2464, 1995.)

In the laid-open publication of Japanese patent application (No. 95-60704), there is disclosed, an inductively coupled plasma chemical vapor deposition apparatus. The above patent application, however, does not present the manufacturing method for amorphous silicon film, microcrystalline silicon film, thin silicon nitride film and thin amorphous silicon film transistors possessing superior electrical and optical matter properties. In addition, in the above disclosed apparatus, dielectric shield is made of material containing oxygen, such as quartz, and during deposition, the generated plasma causes etching of the dielectric shield, resulting in the dissociation of oxygen and other impurities from the dielectric shield which adversely effects thin film quality. Furthermore, in the above mentioned inductively coupled plasma chemical vapor deposition apparatus, gas injection holes which form a portion of gas supply unit are not located at a central region of the reaction chamber but to the side of the chamber. What results is the irregular distribution of supplied reactant gas, making difficult, the production of thin films having a large surface area. Namely, the above mentioned apparatus has a shortcoming a uniform and high density plasma within the reaction chamber is not produced.

According the ICP CVD method of the present invention, a uniform amorphous silicon is provided having superior electrical and other physical properties in areas such as photo sensitivity, electric conductivity, and optical band gap. In addition, uniform film silicon nitride with superior physical properties in areas such as electric conductivity, break down voltage, current density is provided. Thin uniform film silicon with fine crystalline grain size is also provided. Additionally, a thin film transistor having a uniform amorphous silicon film is provided with superior electrical properties in areas such as electric field effect mobility, and threshold voltage. Thus a TFT-LCD of quality can obtained according the present invention.

SUMMARY OF THE INVENTION

The first object of the present invention is to provide an inductively coupled plasma chemical vapor deposition method capable of manufacturing an uniform amorphous silicon film having superior properties in areas of photo sensitivity, electric conductivity, activation energy, and optical band gap.

The second object of the present invention is to provide an inductively coupled plasma chemical vapor deposition method capable of manufacturing an uniform silicon nitride film having superior thin film properties in areas of break down voltage, and current density.

The third object of the present invention is to provide an inductively coupled plasma chemical vapor deposition method capable of producing a thin silicon film having fine and uniform crystalline grains.

The fourth object of the present invention is to provide an inductively coupled plasma chemical vapor deposition method capable of producing thin film transistor containing uniform amorphous film silicon, having superior electrical properties in areas such as electric field effect mobility.

In order to accomplish the above objects of the present invention, there is provided an inductively coupled plasma chemical vapor deposition method for depositing a selected thin film on a substrate from inductively coupled plasma, the method including the steps of: providing a vacuum reaction chamber including an interior bounded, in part by a dielectric shield, the dielectric shield having an amorphous silicon layer on its interior surface, an antenna arranged outside the deposition chamber adjacent to the dielectric shield, where RF power is applied; placing the substrate on a stage within the vacuum reaction chamber; exhausting the vacuum reaction chamber to provide a vacuum state; introducing a reactant gas to the vacuum reaction chamber at a predetermined pressure; and applying RF power to the antenna, whereby inductively coupled plasma for deposition of a thin film from the reactant gas is formed within the vacuum reaction chamber.

BRIEF DESCRIPTION OF THE DRAWINGS

The objects and features of the present invention may be better understood with reference to the following detailed description, appended claims, and attached drawings wherein:

DETAILED DESCRIPTION OF THE INVENTION

Figure 1:
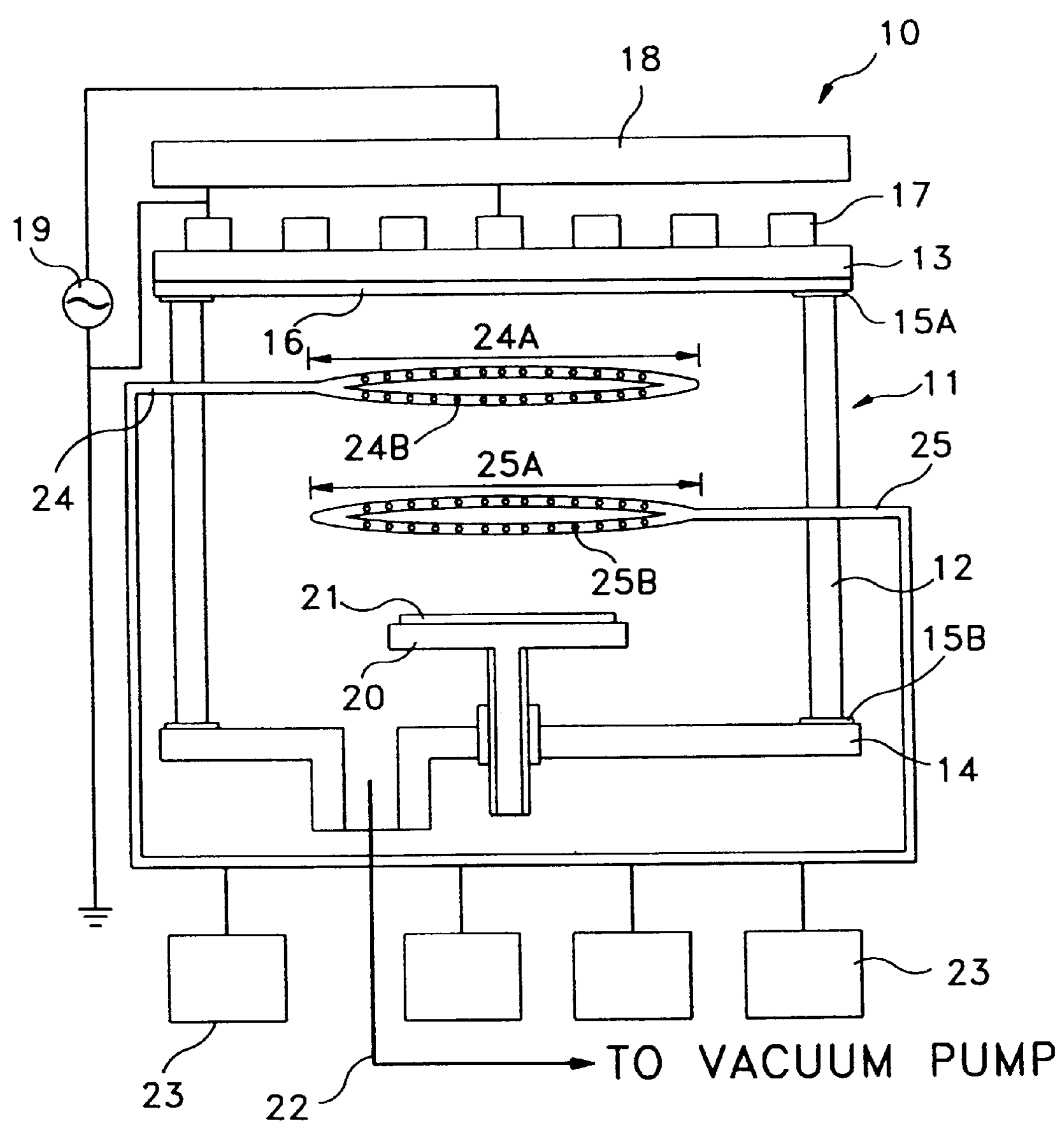
FIG. 1 is a descriptive view of the inductively coupled plasma CVD apparatus in accordance with an embodiment of the present invention.

FIG. 1 shows an inductively coupled chemical vapor deposition apparatus 10 fabricated according to the present invention. The ICP CVD apparatus includes a vacuum reaction chamber 11. The vacuum reaction chamber 11 includes a cylindrical side plate 12, an upper plate 13, and a bottom plate 14. In order to maintain the vacuum reaction chamber 11 in a sealed state, there is provided O-shaped ring(hereinbelow referred to as O-ring) seals 15A and 15B between the cylindrical side plate 12 and the upper plate 13, and between the cylindrical side plate 12 and the bottom plate 13, respectively.

A dielectric shield made of quartz material is formed as the upper plate 13. An insulating ceramic material other than quartz, such as $Al_2O_3$ can also be applied as the upper plate 13. $Al_2O_3$ allows the transmittance of radio frequency power, but blocks out infrared rays.

In order to prevent pollution of the chamber 11 by oxygen or other impurities that are dissociated by etching of the dielectric shield 13 during vapor deposition process, a silicon layer 16 absent of oxygen is provided on the inner surface of the dielectric shield 13 of the vacuum reaction chamber 11. The silicon layer 16 absent of oxygen is composed of amorphous silicon, being about 1,000 Å in thickness. Silicon nitride or silicon carbide may also be used instead of amorphous silicon. Use of the silicon layer absent of oxygen is a major feature in the present invention.

An antenna 17 is installed on the outer surface of the dielectric shield 13. For the antenna 17, it is preferred that a spiral type be provided, which: facilitates application of RF power to a large area; provides a superior and more uniform distribution of RF power; and is relatively simple in shape(refer to H. Sugai et al., Jpn. J. Appl. Phys., 33, 2189, 1994, & Y. Horiike et al., J. vac. Sci. Technol. A13(3), 801, 1995). For use in the current embodiment, either one of the two spiral antennas as shown in FIG. 2A and FIG. 2B is preferably used to obtain a plasma density of $10^{11}$–$10^{12}$ $cm^{-3}$.

Figure 2A:
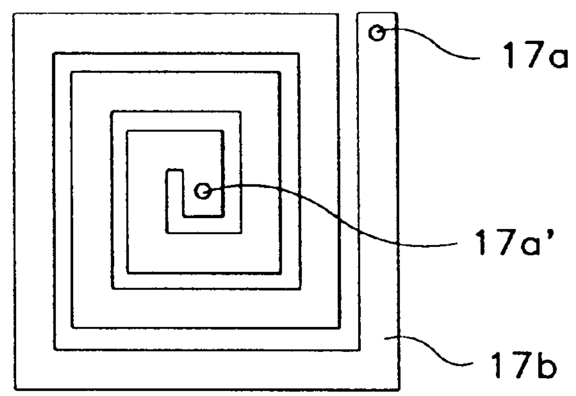
FIG. 2A is a schematic diagram of the antenna structure used in the inductively coupled plasma CDV of FIG. 1.
Figure 2B:
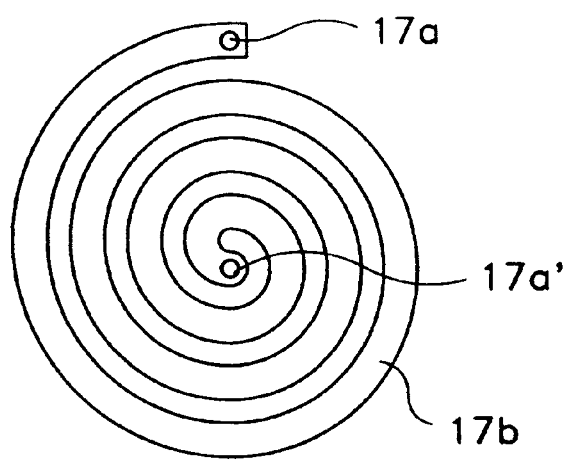
FIG. 2B is a schematic diagram of an alternative antenna structure used in the inductively coupled plasma CDV of FIG. 1.

As shown FIGS. 2A and 2B, the antenna 17 includes terminals 17*a* and 17*b* where RF power is to applied, and coil part 17*b*.

The antenna 17 is also coupled to a matching box 18. The matching box 18 is coupled to a RF power source 19.

A stage 20 is installed piercing through the central portion of the bottom plate 14. A work piece to be fabricated, for example, glass substrate 21 is mounted on the stage 14. An outlet line 22 for exhausting gases from the vacuum reaction chamber 11 is provided at a predetermined position of the bottom plate 14. The stage 20 is electrically insulated from the bottom plate 14, and is designed to have cooling and heating capabilities necessary for plasma deposition.

Reactant gases are supplied into the vacuum reaction chamber 11 by one or more gas supply tubes. The present embodiment shows use of two gas supply tubes 24 and 25. A plurality of gas storage tanks 23 are coupled to the gas supply tubes 24 and 25, in order to supply two or more reactant gases.

The gas supply tubes 24 and 25 includes ring-shaped parts 24A and 25A, which are formed to be positioned at the central portion of the vacuum reaction chamber 11 for a wide and uniform distribution of reactant gases. At predetermined portions along the periphery of respective ring-shaped parts 24A and 25A, there are provided a plurality of nozzles 24B and 25B equally spaced apart at constant intervals.

A method for selected thin film vapor deposition by reactant gas inductively coupled plasma is explained hereinbelow.

A work piece to be fabricated, for example, a glass substrate 21 is mounted on the stage 20 inside the chamber 11. The air inside the chamber 11 is exhausted through the outlet line 22 establishing a vacuum having a pressure of $10^{-6}$–$10^{-7}$ Torr. Electrical current is then applied and the stage 20, whereby the stage is heated to the temperature of 300–500° C.

Reactant gases are supplied to the vacuum reaction chamber 11. Pre-selected reactant gases are supplied from the gas storage tanks 23 to the gas supply tubes 24 and 25. Afterwards, the supplied gases in the gas supply tubes 24 and 25 are introduced into the vacuum reaction chamber 11 through the plurality of nozzles 25A and 25B of the ring-shaped parts 24A and 24B. The reactant gases are selected from dielectric, metal and semiconductor composition gases so that thin film vapor deposition is possible corresponding the selected elements of either dielectric substances, metals, or semiconductor substances. Power is applied to the antenna 17 from the RF source 19 through the matching box 18.

Inductively coupled plasma is thus formed inside the above chamber in order to form a thin film on the substrate 21. The reactant gases supplied forms an inductively coupled plasma which is of a uniform and high density, having a peak ion density of $10^{11}$–$10^{12}$ $cm^{-3}$.

Hereinbelow, the deposition method of forming various thin films according to the present invention, are described 1. Vapor Deposition of Thin Amorphous Silicon Film A substrate is mounted on the stage inside the vacuum reaction chamber. While the substrate is kept in vacuum state, $SiH_4$ is supplied to the chamber through the gas inlet nozzles of the gas supplying unit. Silicon source gases other than $SiH_4$ such as $Si_2H_6$, $SiH_2Cl_2$, etc. may also be used. In the present embodiment, the $SiH_4$ gas has a flow of 0.5 SCCM and a pressure of 70 mTorr. RF power at 40 W is applied to the spiral antenna placed adjacent to the chamber to form inductively coupled plasma. After the substrate temperature reaches 250° C., thin amorphous silicon film is deposited on the substrate.

2. Vapor Deposition of Thin Film Silicon Nitride

A substrate is mounted on the stage inside the vacuum reaction chamber. While the substrate is kept in vacuum state, $SiH_4/NH_3/He$ is supplied to the chamber through the gas inlet nozzles of the gas supplying unit. In the present embodiment, the $SiH_4$ gas has a flow of 0.5–2.0 SCCM, $NH_3$ gas has a flow of 10–60 SCCM, He gas has a flow of 10–100 SCCM. $SiH_4/NH_3$ has a flow rate ratio ranging from 1:10 to 1:30. The total gas pressure ranges from 500–800 mTorr. RF power at 10–120 W is applied to the spiral antenna placed adjacent to the chamber to form inductively coupled plasma. After the substrate temperature reaches 200–300° C., thin film silicon nitride is deposited on the substrate.

3. Vapor Deposition of Thin Film Micro Crystalline

A substrate to be fabricated is mounted on top of the stage inside the vacuum chamber. While the work piece to be fabricated is mounted in the vacuum state, gases of $SiH_4/H_2/He$ are supplied to the chamber through the gas inlet nozzles of the gas supply unit. In the above step, the gas flows of $SiH_4$, $H_2$, He are 0.5–2 SCCM, 5–100 SCCM, 10–100 SCCM respectively, the $SiH_4/H_2$ having a flow rate ratio was 1:10–1:50. The total gas pressure is approximately 200–500 mTorr. RF power of 10–120 W is applied to the spiral antenna to produce inductively coupled plasma inside the chamber. Substrate temperature is raised to 200–300° C. and thin film is deposited on the substrate to be fabricated.

4. Fabrication of Thin Amorphous Silicon Film Transistors

Figure 3A:
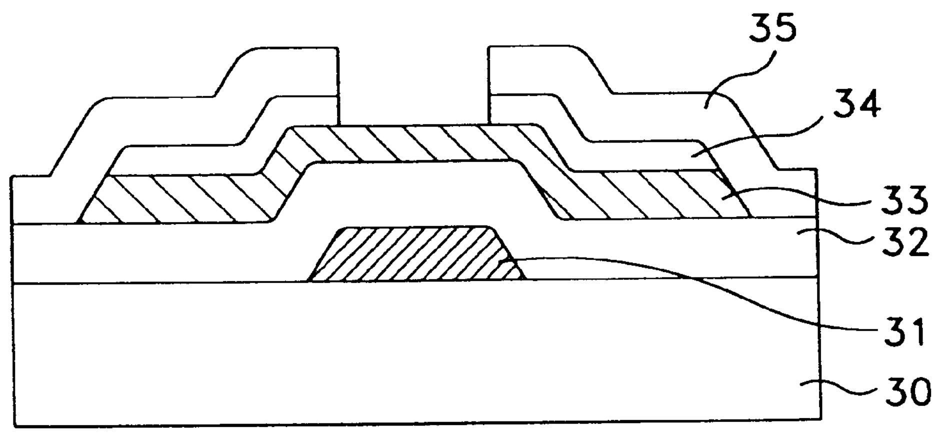
FIG. 3A is a sectional view of the inverted staggered type thin amorphous silicon film transistor manufactured in accordance with an embodiment of the present invention.

Thin amorphous silicon film transistors having inverted staggered structure as shown in FIG. 3A is explained below.

First, on the insulating substrate 30, metal patterned gate 31 of Cr, Al, etc., is formed.

Afterwards, gate insulating layer 32 made of nitride film is formed on the entire surface of the above structure. The gate insulating layer 32 was 3000 Å in thickness in this particular embodiment. The vapor deposition occurred when the flow of gases of $SiH_4$, $NH_4$, He were 0.5 SCCM, 25 SCCM, 70 SCCM respectively, and when the substrate temperature was 300° C. and the gas pressure was 580 mTorr.

On top of the gate insulating layer 32, hydrogenized amorphous silicon(a-Si:H) pattern 33 is formed to serve as a channel or active layer. The condition for amorphous silicon vapor deposition is as follows: gas flow of $SiH_4$ of 0.5 SCCM; substrate temperature of 250° C.; RF power of 40 W; gas pressure of 430 mTorr.

Furthermore, on both sides of the hydrogenized amorphous silicon pattern 33, heavily doped n-type ($n^+$) source/drain regions 34 are formed. In addition, the $n^+$ source/drain regions 34 form ohmic contact with source/drain electrodes 35. As $n^+$ source/drain regions 34(generally called to ohmic contact layer), $n^+$ hydrogenized amorphous silicon($n^+$ a-Si:H) or $n^+$ microcrystalline silicon($\mu$c-Si) can be used, which form ohmic contact with source/drain electrodes 35, to enhance ohmic property. The vapor deposition condition for the ohmic contact layer is as follows: gas flow of $SiH_4$ of 0.5 SCCM; gas flux of $PH_3$ of 0.015 SCCM; gas flow of He of 50 SCCM; substrate temperature of 250° C.; electrical power of 40 W; gas pressure of 430 mTorr.

Figure 3B:
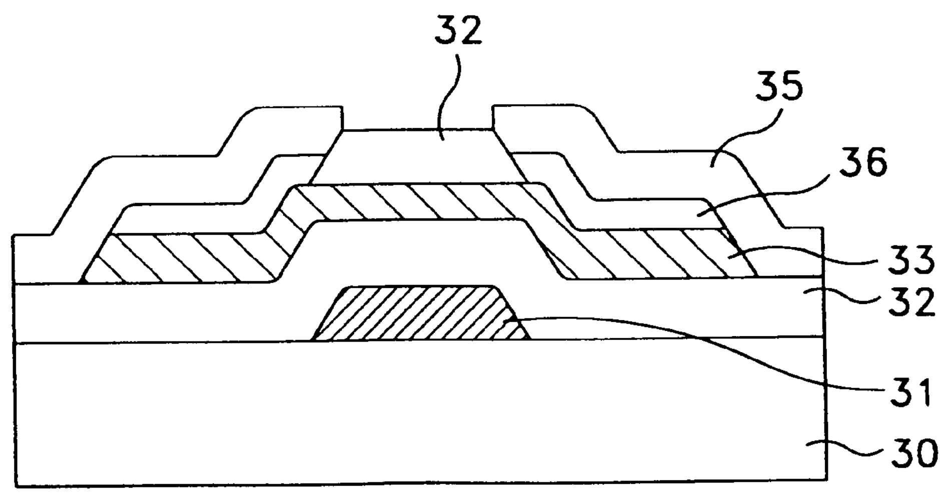
FIG. 3B is a sectional view of the inverted staggered type thin amorphous silicon film transistor manufactured in accordance with an alternative embodiment of the present invention.

An alternative fabricating method for thin amorphous silicon film transistor having inverted staggered structure as shown in FIG. 3B is explained below.

First, gate electrode 31 made of Cr, Al, etc. is formed. Afterwards, ICP CVDs of silicon nitride for the gate insulation layer and hydrogenized amorphous silicon layer 33 takes place, forming an active layer. In the formation of the ohmic contact, Al/Cr is used in source/drain electrodes 35 formation after $n^+$ amorphous silicon or the $n^+$ microcrystalline silicon as the ohmic contact layer 36 is formed.

Furthermore, for the above insulating layer 32 staggered structured $SiO_2/SiN$ or $Al_2O_3/SiN$ may be used instead for mass production enhancement.

Amorphous silicon is generally used as active layer 33 in a-Si:H TFTs. The properties of this amorphous silicon are determining factors in the properties of the TFT. Most of the above amorphous silicon today is manufactured using conventional PECVD apparatus.

Hereinafter, experimental results of electrical and optical properties of thin amorphous silicon film, thin silicon nitride film, and thin amorphous silicon film transistors are explained in detail in accordance with FIG. 4 to FIG. 15B.

Figure 4:
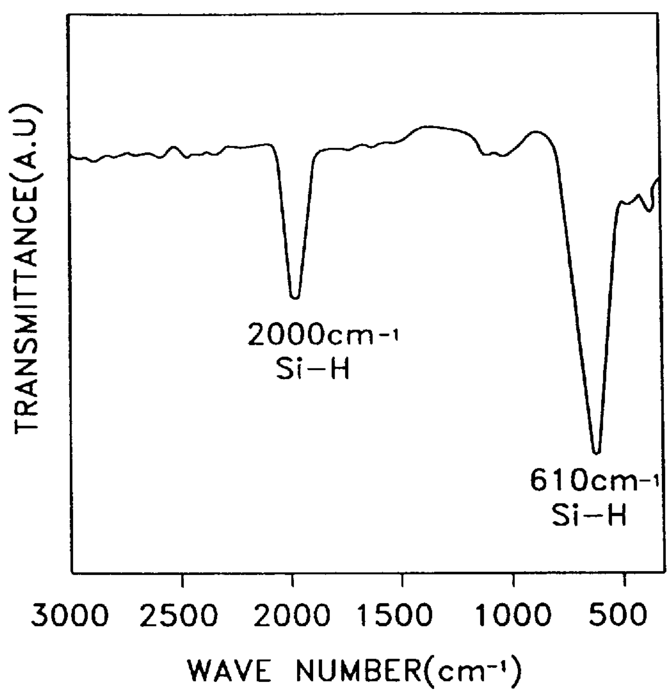
FIG. 4 is a graph showing FR-IR property of a thin amorphous silicon film transistor manufactured in accordance with an embodiment of the present invention.

FIG. 4 shows the FT-IR(fourier transform infrared) characteristic for thin amorphous silicon film fabricated according to the present embodiment. Here, infrared region absorption coefficient of the thin amorphous silicon film vapor deposited on the single crystalline silicon wafer is measured with a BOMEN 100 FT-IR spectroscope. The spectrum measurement results in the infrared ray region show that stretch mode of the Si—H bond appears at a wave number of 2,000 $cm^{-1}$ and bend mode of the Si—H bond appears at wave number 610 $cm^{-1}$. From the above result it becomes clear that the film formed in the present embodiment a typical thin amorphous silicon film. Si—H2 bond is not found in the film formed by this embodiment, and hydrogen content calculated from Si—H bond is found to be 14 at.

Figure 5:
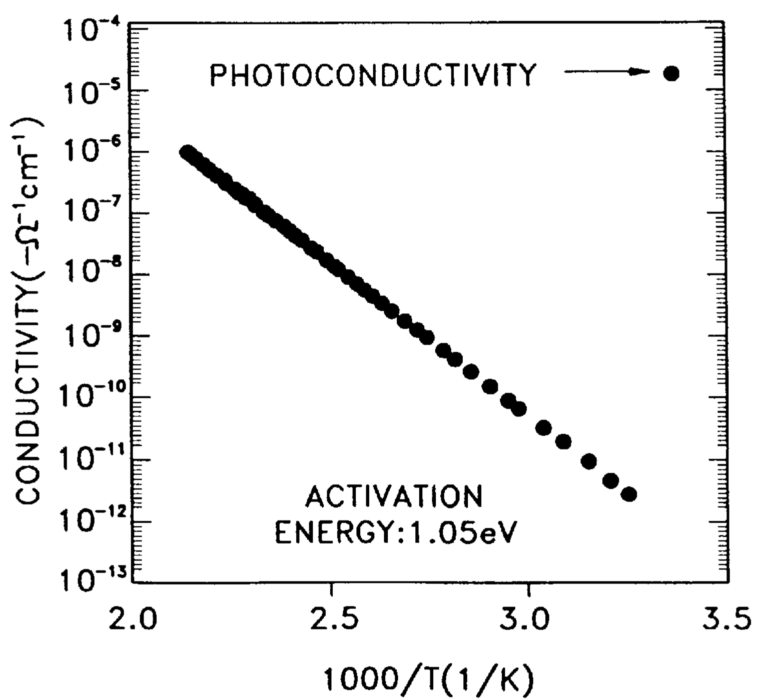
FIG. 5 is a graph showing electrical conductivity of the thin amorphous silicon film manufactured in accordance with an embodiment of the present invention.

FIG. 5 is a graph showing the electrical conductivity of amorphous silicon film formed in accordance to the present embodiment. Herein, a product of Corning 7059 is used as the substrate. On the substrate, there is provided an amorphous silicon film formed by the inductively coupled vapor deposition method. On the amorphous silicon film, there are provided aluminum electrode films formed with a coplanar structure by thermal deposition method. Thereafter, the substrate 21 is mounted on the stage 20 of the inductively coupled plasma CVD apparatus. Afterwards, conductivity as a function of temperature is measured with Keithley electrometer 617 and Keithley multimeter 197. From the measurement result, dark conductivity at room temperature and photoconductivity at a condition of AM-1 are respectively calculated, the former being of $4.3\times10^{-12}$ $\Omega^{-1}cm^{-1}$ and the latter $1.4\times10^{-5}$ $\Omega^{-1}cm^{-1}$. The condition of AM-1 is one where light radiates the specimen at 100 $mW/cm^2$. In addition, activation energy was measured to be 1.05 eV. From the above results, photosensitivity of the thin amorphous silicon film vapor deposited in accordance with the present invention is shown to be $3\times10^{-6}$ indicating that the amorphous material possesses superior physical properties.

Figure 6:
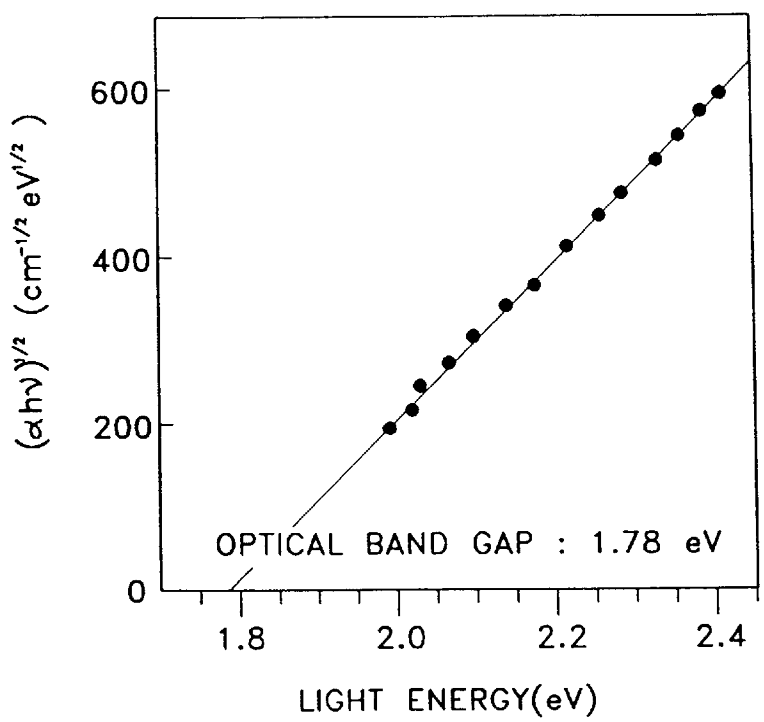
FIG. 6 is a graph showing optical band gap of the thin film amorphous silicon manufactured in accordance with an embodiment of the present invention.

FIG. 6 is a graph showing optical band gap of thin amorphous silicon film formed by inductively coupled plasma CVD apparatus in accordance with the present invention. Optical absorption coefficient a of thin amorphous silicon film deposited on the glass substrate of Corning 7059 is measured with a UV/VIS spectrometer. Optical band gap is obtained from the measured optical coefficient data and optical band gap is calculated from the following equation:

$$(\alpha h\nu)^{1/2}=B(E-E_g^{opt})$$

In the above equation, B is a constant indicating the slope of the band, hν is the incident photon energy, α is optical absorption coefficient, and $E_g^{opt}$ is optical band gap.

As shown in FIG. 6, optical band gap is 1.78 eV. From the above result, the thin film formed in the present embodiment is determined to be a typical thin amorphous silicon film.

Figure 7:
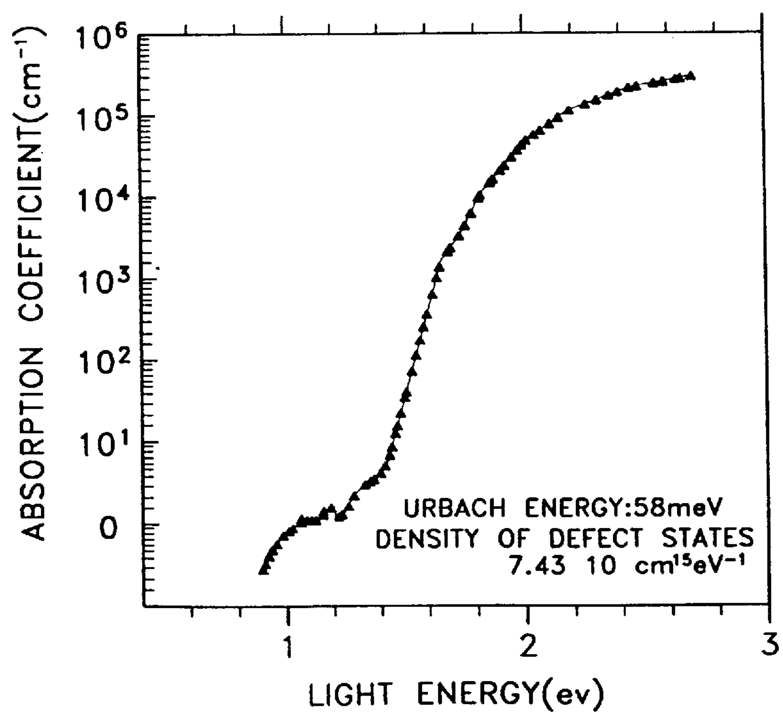
FIG. 7 is a graph showing light absorption property of the thin amorphous silicon film manufactured in accordance with an embodiment of the present invention.

FIG. 7 is a graph showing light absorption characteristic in thin amorphous silicon film formed by inductively coupled plasma CVD apparatus according to the present invention. Urbach energy, $E_u$ is the slope of band tail in the graph of FIG. 7 showing absorption coefficient as a function of light energy at a range of 1.6–1.8 eV. The energy is obtained from the following equation:

$$\alpha=\alpha_0\exp(h\nu/E_u)$$

wherein, α is optical absorption coefficient, $\alpha_0$ is a constant, and hν is a incident photon energy. In addition, density of defect states, $N_d$ is obtained from the following equation:

$$N_d=1.9\times10^{16}\int\alpha_{ex}(h\nu)d(h\nu)$$

wherein, $\alpha_{ex}$ has the following relation(refer to Xu. X et al., Jpn. J. Appl. Phys., 26, L1818, 1987):

$$\alpha_{ex}=\alpha-\alpha0\exp(h\nu/Eu)$$

Urbach energy, Eu and density of defect states, Nd are calculated from the above-mentioned equations, respectively being 58 meV and $7.43\times10^{15}$ $cm^{-3}eV^{-1}$. The values obtained, indicate that the formed film is typical thin amorphous silicon film.

Figure 8:
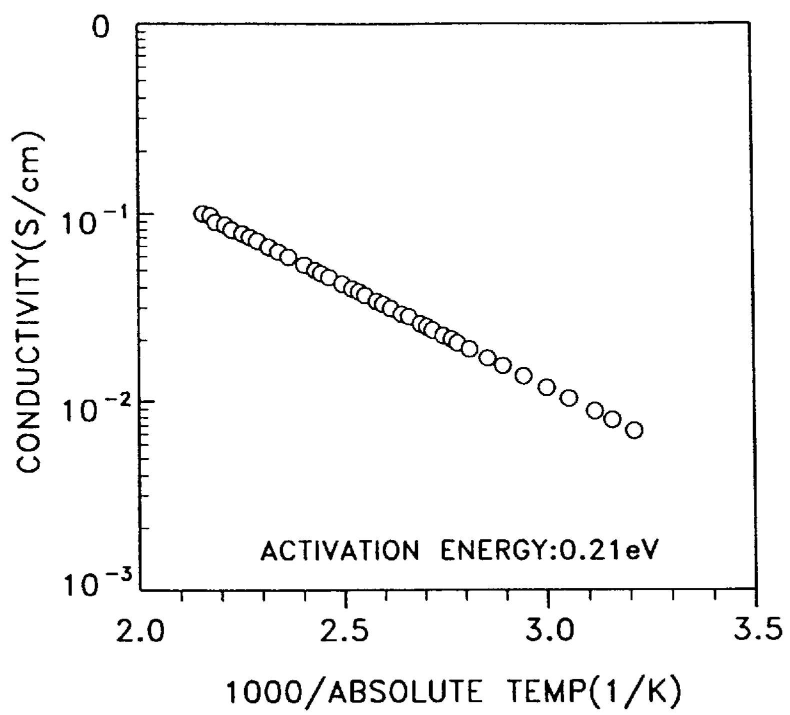
FIG. 8 is a graph showing electric conductivity property of a n-type thin amorphous silicon film manufactured in accordance an embodiment of the present invention.

FIG. 8 is a graph showing conductivity in n-typed amorphous silicon film, the film being formed by inductively coupled plasma chemical vapor deposition apparatus fabricated according to the embodiment of the present invention. Herein, the measurement method for thin microcrystalline silicon film is also applied to measurement for thin n-typed amorphous silicon film deposited on glass substrate. From the measurement result, dark conductivity at room temperature and activation energy are respectively calculated, the former being $7\times10^{-3}$ $\Omega^{-1}cm^{-1}$ and the latter 0.22 eV. From the above results, the thin amorphous silicon film obtained according to the present invention has superior properties in regard to doping efficiency.

Next, thin microcrystalline silicon film is described.

Figure 9:
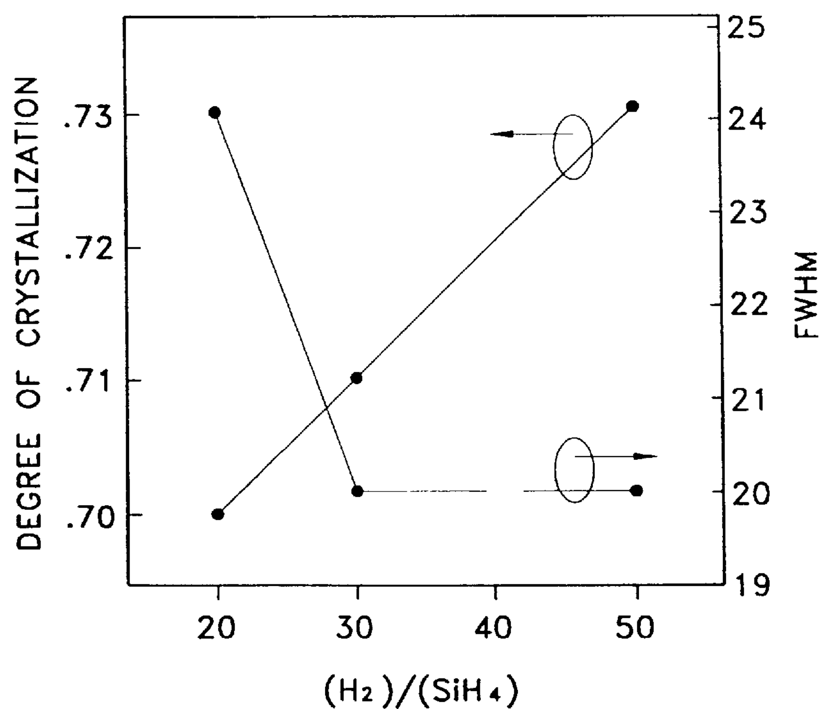
FIG. 9 is a graph showing degree of crystallization and Ramman peak full-width at half-maximum(FWHM) of a thin microcrystalline silicon film manufactured in accordance with an embodiment of the present invention.

FIG. 9 is a graph showing degree of crystallization and full-width at half maximum(FWHM) which are obtained from Raman scattering of thin microcrystalline silicon film, the film being deposited according to the ratio of $H_2/SiH_4$ in inductively coupled plasma CVD apparatus of the present invention.

There is provided a specimen wherein thin microcrystalline silicon film is deposited on a glass substrate of Corning 7059. Degree of crystallization and FWHM of microcrystalline silicon film formed, are obtained using Raman spectroscopy(refer to H. Kakinuma et al., Jpn. J. Appl. Phys. 70, 7374, 1991). Grain size of the microcrystalline silicon film formed, is 200–400 Å, and degree of crystallization is 70–73% as shown in FIG. 8. In considering that typical microcrystalline silicon film has a grain size of 30–200 Å and a degree of crystallization ranging from 2% to 70% (refer to K. Nomoto et al., Jpn. J. Appl. Phys. 29, L1372, 1990), the grain size and the degree of crystallization obtained in the present embodiment indicates that the formed microcrystalline silicon film has superior physical properties.

Figure 10:
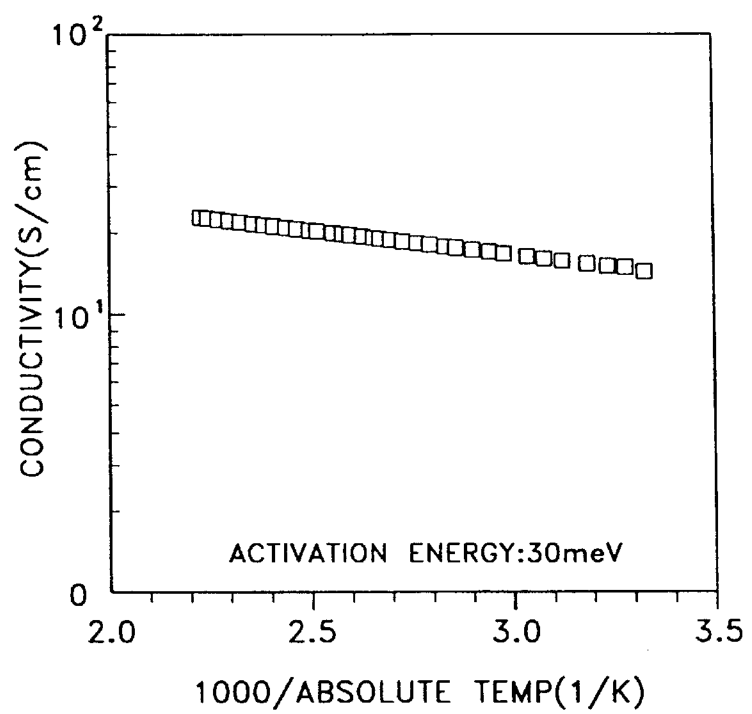
FIG. 10 is a graph showing electrical conductivity property of a n-type thin microcrystalline silicon film manufactured in accordance an embodiment of the present invention.

FIG. 10 is a graph showing conductivity in n-typed microcrystalline silicon film, the film being formed by inductively coupled plasma apparatus fabricated according to the embodiment of the present invention. Herein, a product of Corning 7059 is used as the substrate. On the substrate, there is provided the thin n-doped microcrystalline silicon film formed from the above method. On the microcrystalline silicon film, there are provided aluminum electrode films formed in the coplanar structure by thermal deposition method. Thereafter, the substrate is mounted on the stage 20 of the inductively coupled plasma CVD apparatus in FIG. 1 and held in a fixed position. Afterwards, conductivity as a function of temperature is measured using Keithley electrometer 617 and Keithley multimeter 195A. From the measurement result, dark conductivity at room temperature and activation energy are respectively calculated, the former being 17 $\Omega^{-1}cm^{-1}$ and the latter 30 meV. From the above results, the thin n-doped microcrystalline silicon film obtained according to the present invention has superior properties in regards to doping efficiency.

Next, thin silicon nitride film is described.

Figure 11:
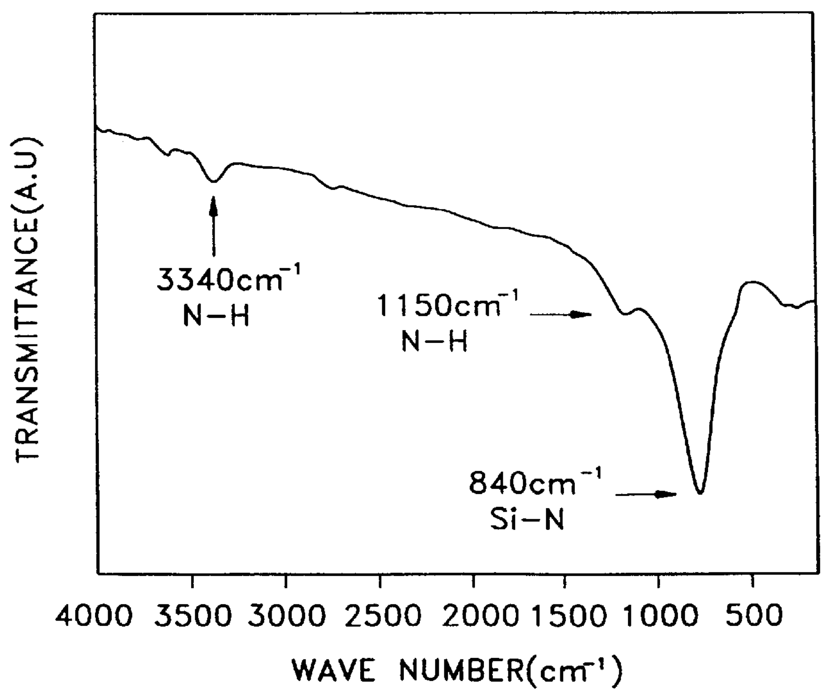
FIG. 11 is a graph showing Fourier transform infrared (FT-IR) property of a thin silicon nitride film manufactured in accordance with an embodiments of the present invention.

FIG. 11 shows Fourier transform infrared(FT-IR) characteristic of thin silicon nitride film according to the present invention. Herein, transmittance at infrared ray region is measured for a specimen wherein thin nitride silicon film is deposited on single crystalline silicon substrate with high conductivity. A FT-IR spectroscope made by the BOMEN company is used as the apparatus for measurement. The measured spectrum result at the infrared ray region shows a stretch mode of N—H bond at a wave number of 3,340 $cm^{-1}$ and a bend mode of N—H bond at wave number 1,150 $cm^{-1}$ appear. In addition, wagging mode of Si—N bond is shown at a wave number of 840 $cm^{-1}$. From the above result, the film formed in the present embodiment is determined to be a typical thin silicon nitride film.

Figure 12:
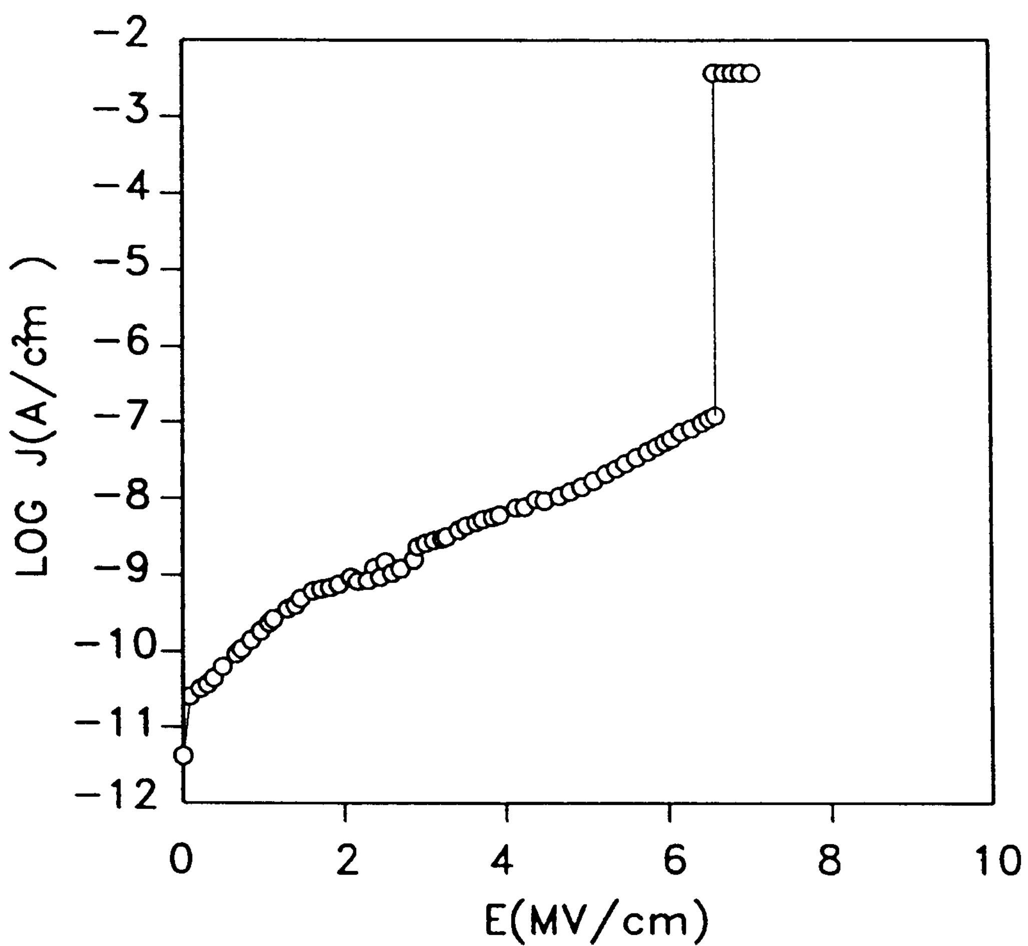
FIG. 12 is a graph showing current-voltage property of the thin silicon nitride film manufactured in accordance with an embodiment of the present invention.

FIG. 12 is a graph showing current-voltage property of thin silicon nitride film formed in inductively coupled plasma CVD apparatus of the present invention.

After a thin silicon nitride film with thickness of approximate 1,000 Å is deposited on p-typed single crystalline silicon substrate having a resistivity of 10–15 Ωcm, an aluminum layer with diameter of 1 mm is formed on the thin silicon nitride film in vacuum by thermal deposition method. Through the above processes, a specimen for test of current-voltage property with MIS structure is fabricated. Current-voltage property of the specimen is measured using Keithley electrometer 617. From the measurement, breakdown voltage is 7 MV, and current density is $10^{-10}$ A/$cm^{21}$ at 1 MV/cm.

Lastly, thin amorphous silicon film is described.

Figure 13A:
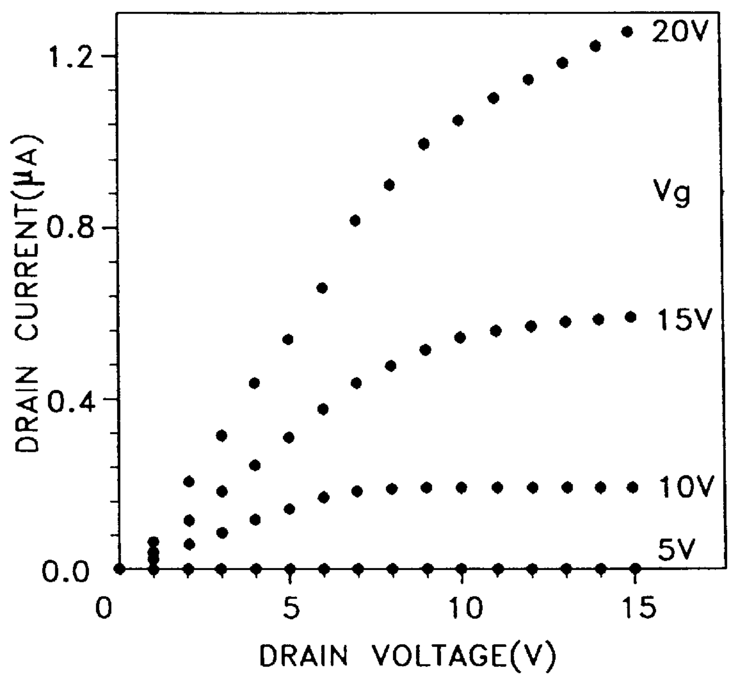
FIG. 13A is a graph showing output property of the thin amorphous silicon film transistor manufactured in accordance with the conventional PECVD method.
Figure 13B:
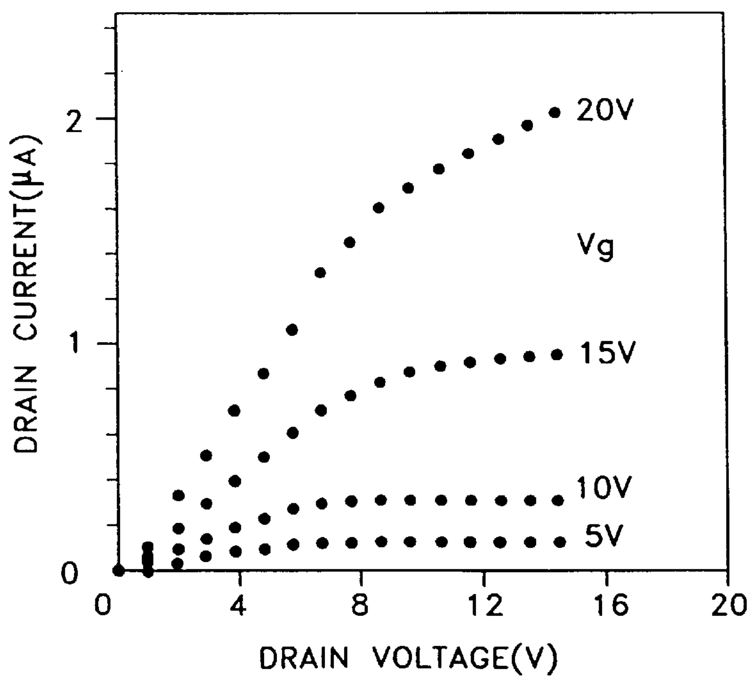
FIG. 13B is a graph showing output property of a thin amorphous silicon film transistor manufactured by the ICP CVD method in accordance with an embodiment of the present invention.

FIG. 13A is a graph showing an output property of thin film transistor(TFT) including an amorphous silicon film fabricated according to plasma enhanced chemical vapor deposition(PECVD) method of the conventional art. FIG. 13B is a graph showing drain current as a function of drain voltage according to gate voltage(Vg), which is according to the present invention. Provided TFT has a width(W) of 60 $\mu$m and a length of 30 $\mu$m.

When gate voltage of 20 V is applied to the gate electrode, drain current in TFT fabricated according to the conventional art is saturated at 1.3 $\mu$A, while drain current in TFT fabricated according to the present invention is saturated at 2.0 $\mu$m, as shown in FIGS. 13A and 13B. From the measurement result, it is determined that TFT according to the present invention has a superior ohmic contact layer than that of the TFT fabricated according to the conventional art. In addition, the TFT fabricated according to the present invention has greater rate of increase in drain current than that of the TFT fabricated according to the conventional art as gate voltage increases.

Figures 14A, 14B:
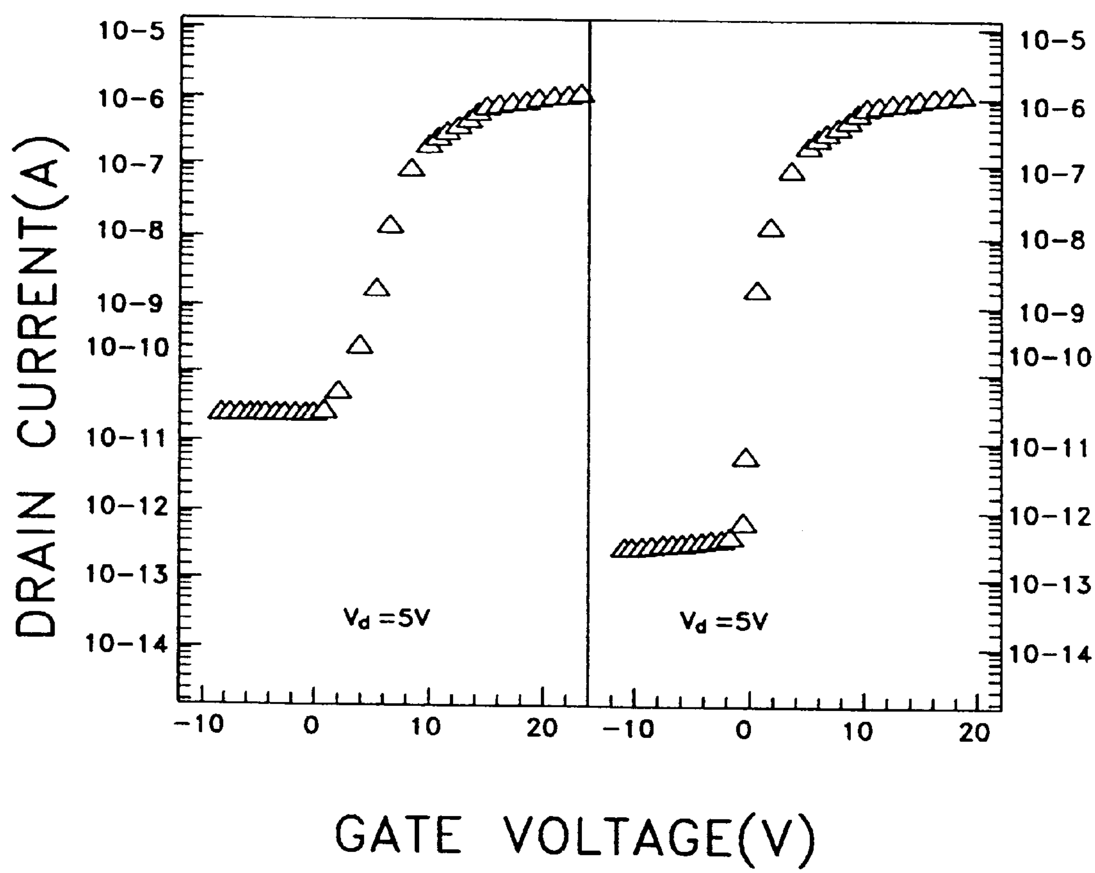
FIG. 14A is a graph showing drain current-gate voltage property of a thin amorphous silicon film transistor manufactured in accordance with the conventional art.
FIG. 14B is a graph showing drain current-gate voltage property of the thin amorphous silicon film transistor manufactured in accordance with an embodiment of the present invention.

FIG. 14A is a graph showing drain current-voltage characteristic of thin film transistor(TFT) including amorphous silicon film fabricated according to PECVD method of the conventional art, the TFT having the structure of FIG. 3A. FIG. 14B is a graph showing drain current as a function of gate voltage at a drain voltage($V_d$) of 5V, according to the present invention.

As shown in FIGS. 14A and 14B, off current of TFT fabricated according to the conventional art approaches a value of $10^{-11}$ order, while off current in TFT fabricated according to the present invention approaches a value of $10^{-12}$ order which is lower than that of the conventional art by 1 order($10^{-1}$ A). Not shown in the drawings, it was measured that hydrogenized amorphous TFT(an amorphous silicon containing hydrogen atoms) fabricated using inductively coupled plasma CVD apparatus according to the present invention has a subthreshold voltage of approximately 0.36 V/dec, and a on/off ratio of more than $10^6$.

Figure 15A:
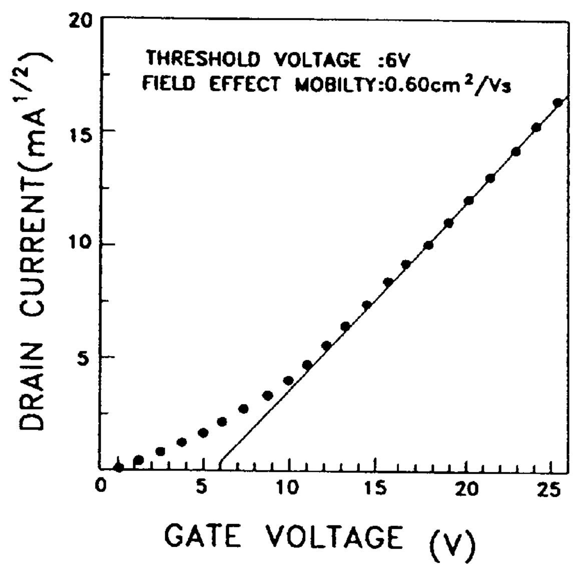
FIG. 15A is a graph showing electric field effect mobility of a thin amorphous silicon film manufactured in accordance with the convention art.
Figure 15B:
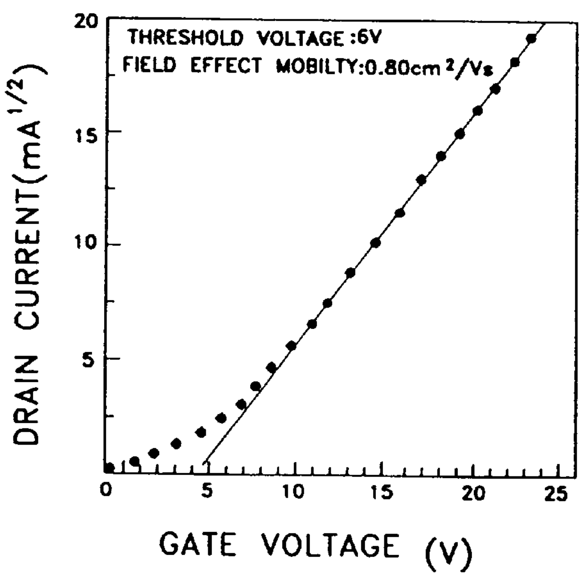
FIG. 15B is a graph showing field effect mobility of the thin amorphous silicon film manufactured in accordance with an embodiment of the present invention.

FIG. 15A is a graph showing field effect mobility of TFT including amorphous silicon film fabricated according to the conventional art. FIG. 15B is a graph showing field effect mobility of TFT including amorphous silicon fabricated according to the present invention.

Field effect mobility, $\mu_{FE}$ is calculated from the following equation:

$$(I_D)^{1/2}=\{\mu_{FE}(W/L)C_i(V_G-V_{TH})V_D\}^{1/2}$$

wherein: threshold voltage as applied in FIGS. 15A and 15B, is 6 V; $\mu_{FE}$ in FIG. 15B is 0.80 $cm^2$/Vs; and $\mu_{FE}$ in FIG. 15A is 0.60 $cm^2$/Vs.

From the results obtained, the thin amorphous silicon film obtained according to the present invention has superior properties than the thin amorphous silicon film obtained according to the conventional art, in doping efficiency.

As described in the present embodiments, inductively coupled plasma CVD apparatus according to the present invention can obtain uniform plasma with high density in the vacuum reaction chamber, wherein the apparatus has: a silicon layer absent of oxygen, the silicon layer being formed on dielectric shield, ring-shaped parts connected to gas supply means, the gas supply means being established such that it is positioned at the central portion of the reaction chamber, and a plurality of gas supply nozzles formed along its periphery at a constant intervals. Thus, the present invention can provide a thin amorphous silicon film with superior physical properties in areas such as photosensitivity, conductivity, activation energy, and optical band gap with a uniform thickness throughout its surface. In addition, there is also provided a thin silicon nitride film with superior physical properties in areas such as breakdown voltage and current density are superior and thickness and with a uniform thickness throughout its surface. Moreover, there is provided a thin microcrystalline silicon film wherein grain size is very small and surface thickness is uniform throughout. In addition, the present invention provides a thin film transistor including a thin amorphous silicon film with superior electrical properties in areas of field effect mobility and threshold voltage so that it is possible to fabricate a thin film transistor liquid crystal display (TFT-LCD) of high quality.

It will be apparent to those skilled in the art that various modifications and variations can be made in a thin film of the present invention without departing from the spirit or scope of the invention. Thus, it is intended that the present invention covers the modifications and variations of this invention provided they come within the scope of the appended claims and their equivalents.

What is claimed is:

1. A thin silicon nitride film formed on a supporting substrate by inductively coupled plasma, wherein said thin silicon nitride film has a breakdown voltage of 7 MV and has a current density of $10^{-10}$ A/$cm^2$ at 1 MV/cm.

* * * * *

UNITED STATES PATENT AND TRADEMARK OFFICE
CERTIFICATE OF CORRECTION

PATENT NO. : 6,380,612 B1
DATED : April 30, 2002
INVENTOR(S) : Jang et al.

It is certified that error appears in the above-identified patent and that said Letters Patent is hereby corrected as shown below:

Title page,
After Item [22], please insert the following:

-- [30] Foreign Application Priority Data

| | | | |
|---|---|---|---|
| Mar 18, 1996 | [ROK] | Republic of Korea | 96-7201 |
| Jun 13, 1996 | [ROK] | Republic of Korea | 96-21113 -- |

Column 7,
Line 14, after "coefficient", please cancel "a" and substitute -- $\alpha$ -- therefor; and
Line 50, please cancel "Nd" and substitute -- $N_d$ -- therefor.

Column 9,
Line 3, please cancel "$A/cm^{21}$" and substitute -- $A/cm^2$ -- therefor.

Signed and Sealed this

First Day of July, 2003

JAMES E. ROGAN
*Director of the United States Patent and Trademark Office*